United States Patent [19]
Dillow

[11] Patent Number: 5,550,574
[45] Date of Patent: Aug. 27, 1996

[54] METHOD AND APPARATUS FOR EXPOSING LIGHT SENSITIVE MATERIAL BY MEANS OF A COPYING MACHINE HAVING A VERTICALLY MOVABLE LASER UNIT

[75] Inventor: Brian Dillow, Hägersten, Sweden

[73] Assignee: Misomex Aktiebolag, Hagerstein, Sweden

[21] Appl. No.: 137,194

[22] PCT Filed: May 26, 1992

[86] PCT No.: PCT/SE92/00356

§ 371 Date: Oct. 26, 1993

§ 102(e) Date: Oct. 26, 1993

[87] PCT Pub. No.: WO92/21518

PCT Pub. Date: Dec. 10, 1992

[30] Foreign Application Priority Data

May 28, 1991 [SE] Sweden .................................. 9101619

[51] Int. Cl.$^6$ ...................................................... B41J 2/435
[52] U.S. Cl. .............................. 347/262; 355/86; 247/264
[58] Field of Search ......................... 355/85, 86; 347/262, 347/264

[56] References Cited

U.S. PATENT DOCUMENTS

| | | | |
|---|---|---|---|
| 4,052,603 | 10/1977 | Karlson | 355/86 |
| 4,159,991 | 4/1979 | Dillow. | |
| 4,993,696 | 2/1991 | Furukawa et al. | 269/59 |
| 5,322,268 | 6/1994 | Okutsu et al. | 355/312 |

FOREIGN PATENT DOCUMENTS

| | | |
|---|---|---|
| A20427222 | 5/1991 | European Pat. Off. . |
| 2474708 | 1/1980 | France . |
| 2725308 | 12/1977 | Germany . |
| 162469B | 10/1991 | Germany . |

*Primary Examiner*—Mark J. Reinhart
*Attorney, Agent, or Firm*—Larson and Taylor

[57] ABSTRACT

A method and an apparatus for exposing multi-pages original images or several separate text and/or picture portions onto a light sensitive material like an offset plate or an intaglio plate by a laser exposure process. The apparatus includes a cassette for a light sensitive material, a laser unit for exposing the light sensitive material, a discharge conveyor for the exposed light sensitive material, and an exposure table which is stepwise movable between the plate cassette and the discharge conveyor and under the laser unit. The exposure table is formed with a device for holding the light sensitive material in a predetermined position thereon. The laser unit includes a laser carriage which is arranged for taking two different positions, namely a raised position in which the exposure table with the plate can be moved freely under the laser unit, and a lowered position, in which the laser carriage is being pressed into locking engagement with a portion of the plate on the exposure table for making it impossible for the plate and the laser unit to move in relation to each other. When locked in place, a laser gun movably mounted on the laser carriage is moved to expose the underlying portion of the plate.

5 Claims, 3 Drawing Sheets

METHOD AND APPARATUS FOR EXPOSING LIGHT SENSITIVE MATERIAL BY MEANS OF A COPYING MACHINE HAVING A VERTICALLY MOVABLE LASER UNIT

The present invention relates to a method and an apparatus for exposing multi-pages original images onto a light sensitive offset plate or an intaglio plate by means of a laser exposure/burning process.

Lately some print makers have started to use laser light beams for exposing light sensitive offset plates or intaglio plates. The advantages of using laser is, among other things, that it is possible:

to execute the exposure directly from computer stored information concerning text, sketches and half-tone pictures etc. without the need of using a negative of positive transparent films, as has so far been usual, that the size of the dots which are to create the image can, within wide limits, be determined and controlled, in particular the dot creating a half-tone picture in the print and which corresponds to the screen dot in conventional screen copying processes, and this is possible in that the laser light builds up the screen dot from a large number of pixels, generally between 64 and 256 pixels per screen dot, and that therefore the gradation of the grey scale of the laser reproduced image on the printing plate can be varied within wide limits.

Like in conventional copying processes the laser light provides an activation of the illuminated part of the printing plate so that, in the succeeding developing process, said activated printing plate parts become ink carrying if the printing plate is of the positive type, or non-ink carrying respectively if the printing plate is of the negative type.

There are today three main methods of laser exposing printing plates, namely exposing a plate lying on a flat bed, the so called flat bed method, exposing a plate mounted inside a cylindrical drum whereby the exposing is made from inside the curved plate, which process is called internal drum method, and exposing of a plate mounted exteriorly on a cylindrical drum, whereby the exposure is made from outside, which process is called external drum method.

Each one of said three methods is disadvantageous in some respects:

In the flat bed method the entire printing plate is exposed in one single exposure step by means of a sweeping laser light beam. Generally the laser apparatus including the so called "laser gun" is stationary, whereas the printing plate is displacable on an exposure table in relation to the laser unit. During the exposure the laser unit emits an oscillating light beam which hits the plate while said plate is slowly moving past the laser unit until the entire plate has been exposed. Alternatively it is possible to keep the exposure table still standing and to allow the laser unit to wander over the plate during the exposure. In this type of the flat bed copying machine the distance from the laser gun or the lens system thereof to the side edges of the printing plate is substantially longer than to the central parts of the plate, and this has as an effect that the sharpness and the shape of the laser dot exposed on the printing plate varies depending on where the laser beam hits the plate. For reducing, to some extent, the problem with this variation in dot sharpness and shape the laser gun generally is mounted at a relative high distance above the printing plate, and for equalizing the always existing unavoidable variations in dot sharpness and shape in this type of copying machine the laser gun generally is adjusted so that the sharpness of the laser dot is located slightly too high at the edges of the plate and slightly to low at the central parts,of the plate. As a consequence an ideal dot is located somewhere between the centre and the edges of the plate. Depending on the said machine design the laser copying machine is high and clumsy, and the laser burning is relatively uneven when comparing different parts of the printing plate. Another problem is to, as far as possible, eliminate the vibrations which unevitably appear when the copying table and the laser unit move in relation to each other;

Depending on the large height of the apparatus it is very sensitive to vibrations, and even with a very little unexpected movement of the laser dot on the printing plate, for instance caused by a slight shaking of the laser gun, the dot will be unsharp on the printing plate, in particular since the laser gun normally projects between 64 and 256 pixels for creating each separate screen dot when exposing an optimum grey scale;

For a good result in this method it is necessary that the base for the printing plate, generally the base of the copying machine, is extremely even, since even a very little un-eveness in the surface makes the sharpness of the dots vary;

It may also be very difficult to move the printing plate and the laser gun with an exact speed and a uniform movement in relation to each other, and it often happens that there is a slight difference in speed and uniformity and this makes the laser dots slightly overlap each other or to be loacted too far from each other, and this, in turn, makes stripes appear in the ready print;

The necessary large working area for the laser gun makes it necessary to use a heavy laser gun and a large and expensive lens system, and therefore the apparatus will be remarkably expensive;

In the internal and external drum methods the printing plate is generally more safely secured in relation to the laser gun than in the flat bed method, and therefore a better copying quality is obtained than with the flat bed machines. In the internal and external drum methods, however, there are on the contrary problems in mounting of the printing plate inside and on the outer surface of the drum respectively; in some cases there also are problems in obtaining an even laser exposure all over the width of the plate, especially in the internal drum method; there are also problems in obtaining an exact fixedly mounting of the printing plate on the drum (for accurate plate register); and usually there is a restricted maximum size for the printing plate.

A serious problem in all known copying methods is that the printing plate and the laser unit may move in relation to each other during the copying process. Therefore a special purpose of the invention is to foresee that the laser unit and the printing, plate are safely secured in relation to each other before the copying process is started, thereby eliminating any possibility of said parts to move in relation to each other.

The object of the invention further is to suggest a method and an apparatus which solves most of the above mentioned problems and disadvantages in the prior known methods and apparatus; and to suggest a method and an apparatus which further allows a substantially fully automatized exposure of several successive printing plates of the same or varying size; in which the apparatus is substantially lower and requires for less precision and accuracy in the manufacture than the apparatus for executing the prior known methods; in which the laser gun is mounted substantially closer to the printing plate to be exposed than in prior known apparatus; in which the apparatus is substantially less sensitive to shakings and vibrations; and in which the apparatus is simpler and cheaper than all the above mentioned three prior known laser copying machine types.

According to the invention said objects are fulfilled in that the laser unit is lowered and is safely locked to the plate laying on the exposure table before the exposing is started, whereupon the printing plate is exposed in several stages by means of laser light beams, and whereby the plate accordingly is exposed in several successive stages with only a minor part of the plate at the time, for instance with two or four pages at the time of the usually 16, 32 or 64 pages large printing plate This is made by an automatized handling comprising collecting an un-exposed light sensitive plate, exposing said plate by the action of four different but cooperating movements, namely a) a stepwise displacement of a plate table in a certain directions the X-direction, b) a stepwise displacement of the laser unit in a Y-direction and c) a lowering and locking of the laser unit against the printing plate, and d) a successive movement of a special part (the laser gun) of the laser unit in the X-direction or the Y-direction during the oscillatory sweep exposure, which movement alternatively can be made in the X-direction or the Y-direction, and finally an expelling of the exposed printing plate from the copying apparatus for subsequent developing and other handling.

The method also makes it possible to make use of two or more small laser units parallel to each other.

It should be emphasized that the designation "light sensitive plate" or "printing plate" is meant to include not only offset and intaglio printing plates but also any other possible types of light sensitive material like light sensitive films (negative and positive).

Further characteristics of, and advantages with, the invention will be evident from the following detailed specification in which reference will be made to the accompanying drawings, which illustrate an embodiment of an apparatus according to the invention.

In the drawings FIG. 1 diagrammatically shows a copying plant according to the invention having, for the sake of clearness the protection housings for the plate magazine and the plate expeller partly opened.

FIG. 2 diagrammatically the same plant as in FIG. 1 with cover parts removed and showing more in detail the plate feeder and the plate expeller.

Figure 1:
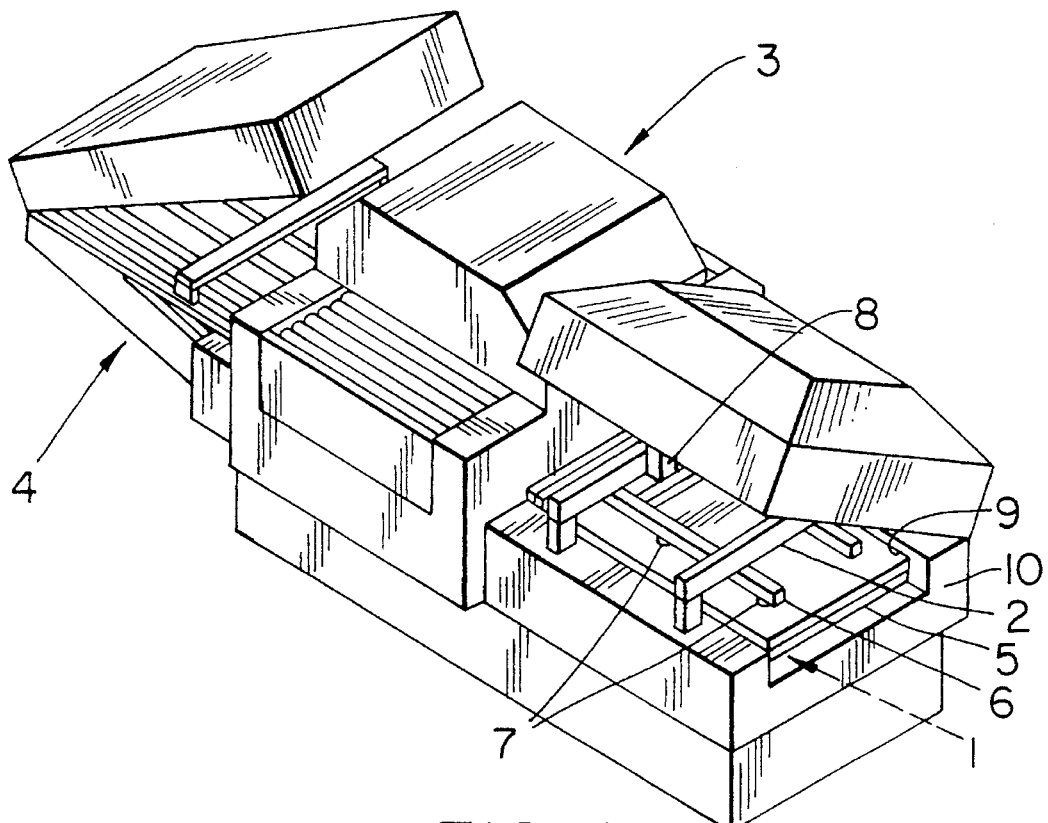

The basic structure of the copying machine shown in the drawings is of the known type which is manufactured by the Swedish corporation Misomex Aktiebolag and which is marketed under the name "Step And Repeat" machine and which comprises five main parts, namely a plate cassette 1, a plate loading lift 2, a laser unit 3, a discharge conveyor 4 and a movable exposure table 5.

The plate loading lift 2, the laser unit 3 and the discharge, conveyor 4 are formed as a continuous path which is serviced by the movable exposure table 5. At one end the exposure table 5 is arranged to receive an un-exposed light sensitive plate 6, which is collected by the plate loading lift 2, and at the other end the exposure table 5 puts the exposed plate 6 down on the discharge conveyor 4, which feeds the plate directly into a (not shown) developing unit which is directly connected to the copying machine, The plate cassette 1, which is only diagrammatically indicated in the drawings, is mounted underneath the plate loading lift 2, and it is designed for receiving such a large number of plates or other light sensitive means which correspond to an entire working period, for instance 50–75 plates, so that the machine can operate fully-automatized for an entire (day) working period. As usual the plates in the plate cassette preferably may be formed with punched register bores which fit register pins of the exposure table, so that any and all successively collected plates are placed in a very accurately predetermined position on the exposure table and are exposed by the laser unit over a very exactly determined area of the plate.

Alternatively register bores may be punched in the plate after the plate is placed on the exposure table. In such case the register becomes exact in relation to the exposed portions of the plate.

The plate loading lift 2 comprises a system of tubes having suction cups 7, and it is arranged for being lowered to the plate cassette 1 by means of hydraulic or pneumatic cylinders 8 for seizing the uppermost plate 6 in the casette 1, for being lifted together with the plate and for being lowered thereby depositing the plate on the exposure table 5. The machine is programmed so that the exposure table 5 is located in its end position far from the plate loading lift when a new plate 6 is being picked up.

The movable exposure table 5 on which the plate 6 is laid down is movable along a straight path 9 of the machine base 10, which path can be referred to as the X-direction, between an end position far to the right in the drawings, in which position the plate 6 is laid down on the table, an intermediate position underneath the laser unit 3, in which position the plate 6 is exposed, and an end position far to the left in the drawings, in which position the plate 6 is put down on the discharge conveyor 4 for subsequent transportation to a developing machine.

Figure 3:
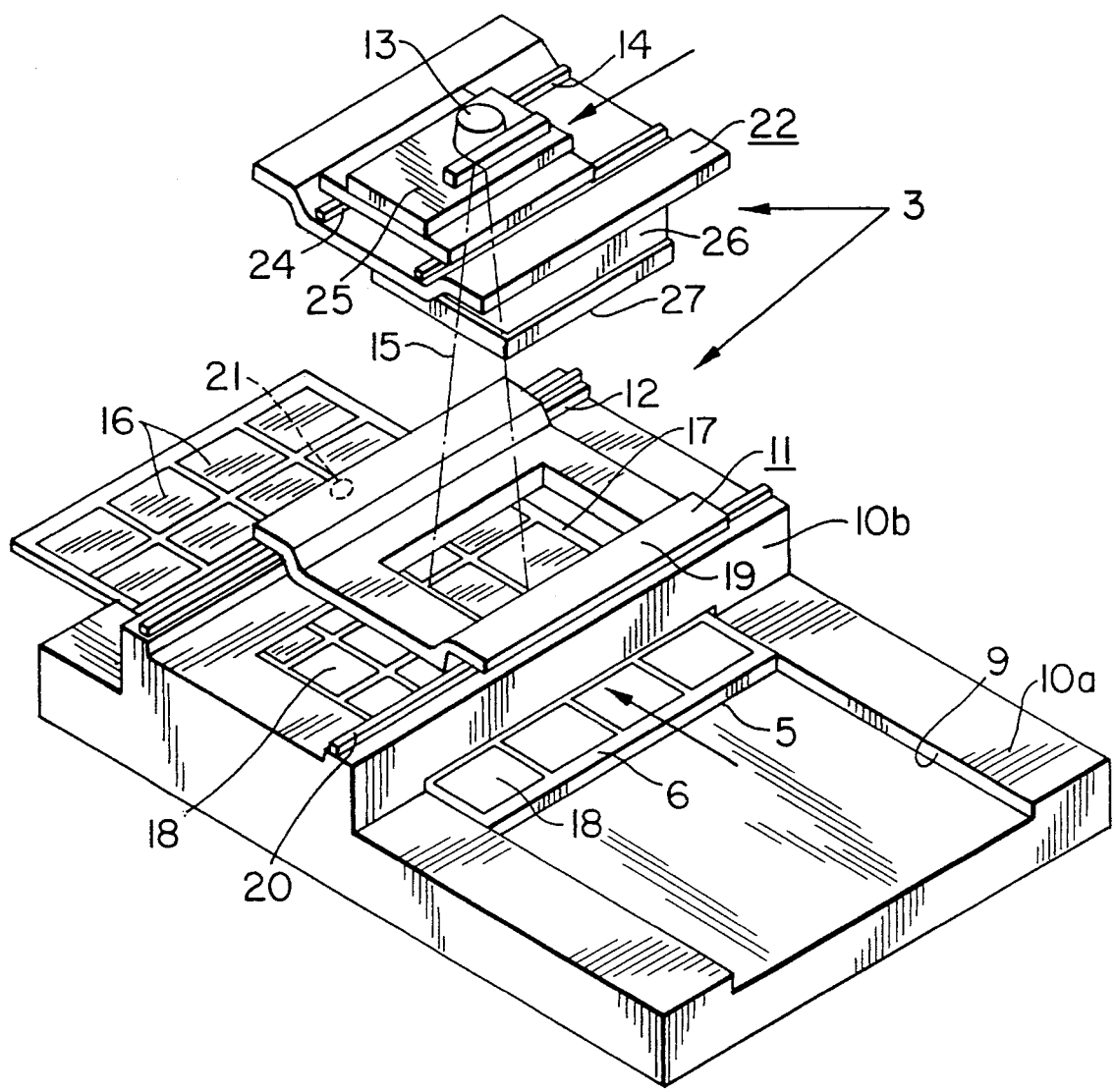
FIG. 3 is an exploded view of the laser unit and parts of the machine base, which figure more in detail shows the step copying process in the apparatus according to the invention.
Figure 4:
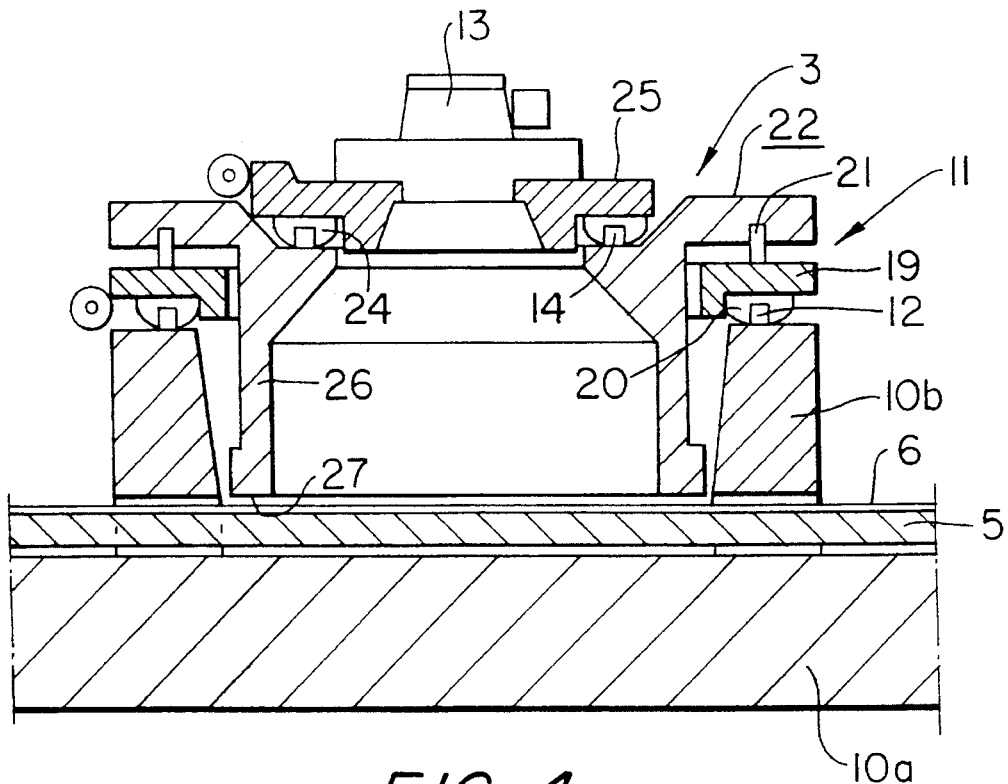
FIG. 4 is a fragmentary, vertical view through the copying machine seen along line IV—IV of FIG. 2 and illustrating the situation during the setting of the apparatus to the intended plate part to be copied, and FIG. 5 correspondingly shows the situation during the copying process.
Figure 5:
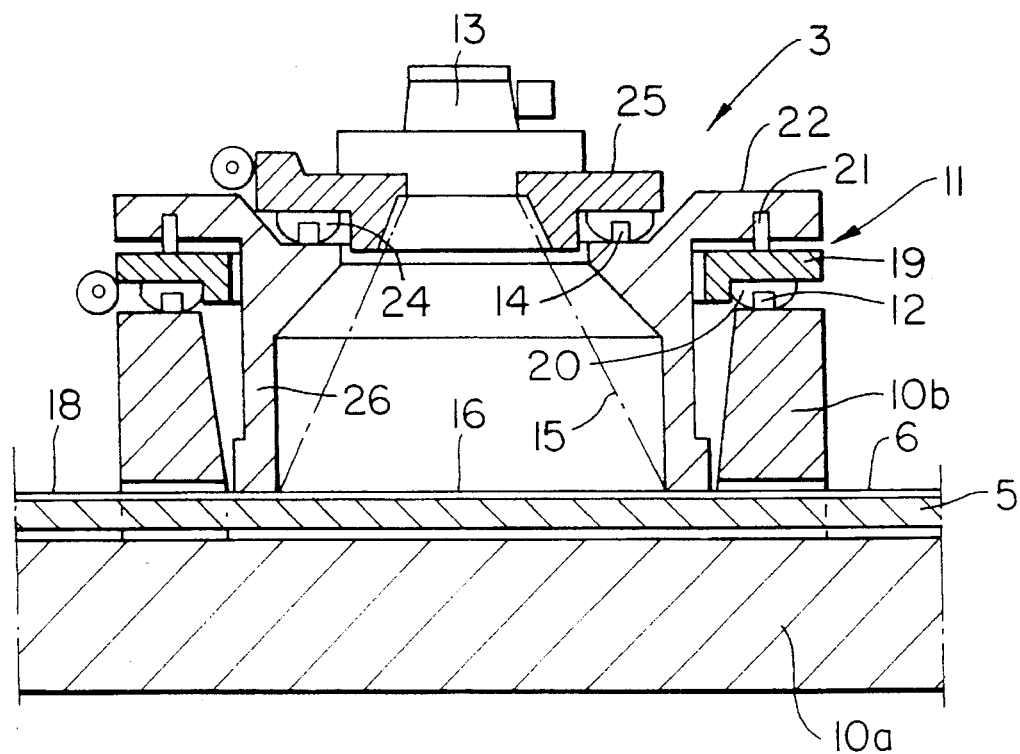

The laser unit 3 is mounted on a carriage 11 which is movable in a direction, which can be referred to as the Y-direction and which is perpendicular to the above mentioned X-direction of the exposure table 5. The laser carriage rolls on a path 12 which is integral with the machine base 10. The laser carriage 11, in turn, carries the actual laser gun 13 with its lens system movable along a path 14, which may extend in the X-direction or the Y-direction depending on the desired sweeping direction of the laser light beam. In FIGS. 3–5 the path 14 of the laser gun 13 is shown extending in the Y-direction, that is parallel to the path 12 of the laser carriage 11.

The laser unit is arranged for exposing of only a minor portion of the light sensitive plate at the time, and the laser gun 13 therefore can be of small size and can be mounted relatively close to the exposure table 5 with the plate 6. As mentioned above this involves several advantages, of which it should be emphasized that there is a very little risk of shaking-unsharpness on the plate 6 on the exposure table 5, that the laser gun 13 and the lens system thereof can be made of relatively small size and can be manufactured to low costs, that a good precision and accuracy is obtained for the laser dots on the light sensitive plate, and that there is a relatively little difference in focal distances at different parts of each exposure portion of the plate 6.

As one typical example FIG. 3 shows a printing plate 6 comprising thirty-two print pages and in which plate four pages are being exposed at the time. For the sake of clearness the laser gun 13 is shown exploded from the laser carriage 11. The light beam sweeping movement of the laser gun 13 shown with the phantom lines 15. The parts 16 of the plate 6 marked with the hatched lines have already been exposed whereas the non-exposed portions of the plate are shown blank. Upon exposure of four pages at the time, as in the illustrated case, the laser carriage 11 adjusts itself in two alternative Y-positions, one position of which is shown in FIG. 5, and in which the laser light beam during the exposure sweeps in an oscillating and successively in the Y-direction extended movement from the far remote longitudinal edge 17 of the plate 6 and over four pictures or pages. In the illustrated position the laser beam has sweep-exposed two complete and two half pages in the adjusted position.

When the four actual pages have been exposed the laser carriage 11 moves to its second end positon in which the laser beam exposes the four additional pages 18 in this X-row of pair of pages. When also said four pages 18 have been exposed the exposure table 5 with the plate 6 moves a distance towards the discharge end corresponding to two rows of pages and the laser beam starts exposing the last series but one of four pages, etc.

The laser unit is of a known type and is therefore not to be described in detail. It comprises a laser gun having a lens system which is adjusted so that the focus of the laser light beam falls on the light sentive plate. The laser may be of various types. As an example. of a suitable laser beam source can be mentioned argon-ion-laser. Of course other types of laser beam sources can be used.

FIG. 4 and 5 shows the laser unit 3 more in detail. It is obvious that the machine base 10a is directly integral with the laser base 10b, and that the path 12 of the laser base 10b provides a guide for the laser carriage, which is generally referred to with numeral 11. The laser carriage 11 comprises a carriage means 19 which with a grooved bar 20 is slidable on the base path 12, and which over a number of hydraulic cylinders 21 carries the laser carrier 22. The laser carrier 22 also-has a path on which a grooved bar 24 of a wagon 25 for the laser gun 13 is movable.

The laser unit has two moving possibilities firstly the carriage with the laser carrier 22 can be moved on the laser base 10b; and secondly the laser gun 13 as mounted on its wagon 25 can be displaced on the laser carriage 22. In the illustrated case the displacements follow in the same direction, the Y-direction, but it is obvious that the laser gun 13 as well may be moved in a direction (X-direction) which is perpendicular to the direction of movement of the laser carrier 22.

It is important to the invention that the laser carrier 22 with the wagon 25 and the laser gun 13 can be raised and lowered by means of the cylinders 21. The object thereof is that the laser unit can be locked to the plate 6 lying on the exposure table 5. To this end the laser carrier 22 is formed with a downwards extending, box-formed foot 26 which at the bottom thereof may have a sealing antiskid element 27 adapted to get into contact with the plate 6.

This embodiment is good for two reasons:

a) by lowering the carrier foot 26 with its sealing element 27 into contact with the plate 6 it is not possible for the laser unit 3 to move in relation to the plate 6, and the laser light will fall with good sharpness and precision on each separate point of the plate;

b) depending on the box-shape of the foot 26 of the laser carrier 22 said foot effectively restricts exactly the area of the plate 6 which is to be exposed, and the exposing consequently is made only within this specific area.

FIG. 4 shows the laser unit 3 in its raised position in which position the exposure table 5 and/or the laser carriage 11 can be moved to a new adjustment position, or already exposed plate 6 can be expelled to the discharge conveyor. FIG. 5 shows the same apparatus in its fully lowered position in which position the plate 6 is being exposed.

Figure 2:
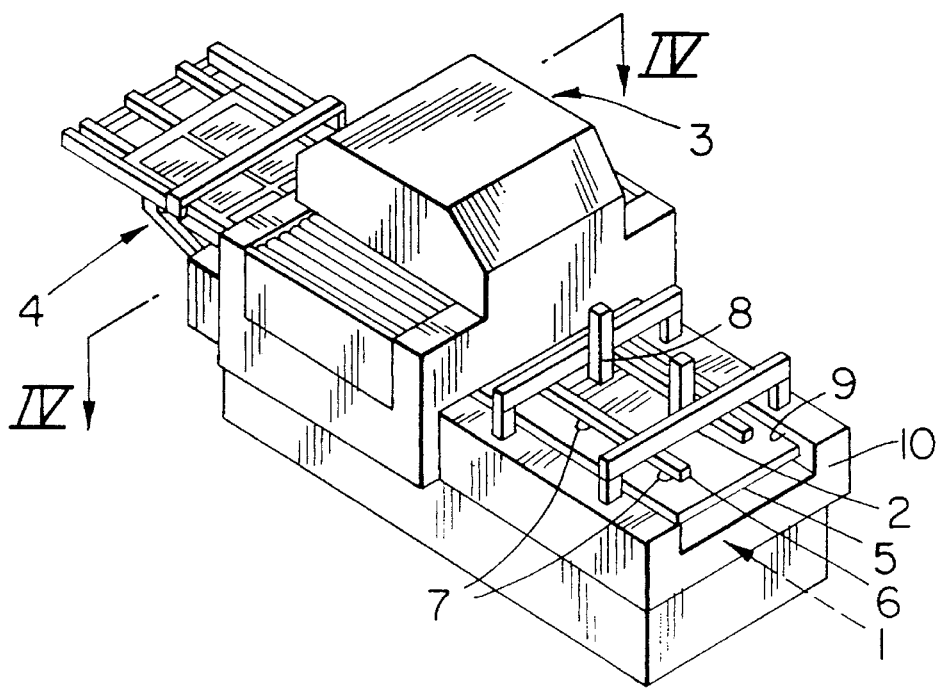

The entire apparatus plant comprising the plate cassette 1, the plate loading lift 2, the laser unit 3 and the discharge conveyor 4 are formed light sealed, so that the plant can be used also in soft daylight. The discharge conveyor thereby is connected to a developing station which can be placed in any type of dark-room. It is indicated in FIGS. 1 and 2 that the laser gun 13, during its movement in relation to the laser carrier 22, is light sealed by means of a Venetian blind or a similar light sealing means.

The described apparatus functions as follows:

In the starting position the exposure table 5 is retracted from the plate loading lift 2, and said lift thereby can be lowered to collect and lift the uppermost light sensitive plate 6 of the plate cassette 1. The laser unit 3 is in its raised position shown in FIG. 4. The exposure table 5 now is moved to a position under the plate 6 hanging in the plate lift 2, whereupon the plate 6 is lowered and is secured, by means its punch holes, on equivalent locating pins of the exposure table. The plate loading lift 2 is lifted, and the exposure table 5 with the plate 6 secured thereon is moved such a long distance in the X-direction under the laser unit 3 which corresponds to the number of Y-direction (longitudinal) rows of pages to be exposed. Concurrently therewith the laser unit 3 is moved in the Y-direction to a position for exposing the number of X-direction (cross) rows of pages which are to be exposed, e.g. two or four pages out of an 8-, 16- or 32-pages light sensitive plate.

The laser unit 3 now is lowered by the actuation of the hydraulic cylnders 21 so that the bottom of the foot 26 of the laser carrier 22 engages the upper surface of the plate 6.

In the position now taken the actual number of pages are exposed in that the laser gun 13, in a light beam sweeping movement 15, moves in the Y-direction (alternatively in the X-direction) over the four pages on its path 14 of movement.

After the said four pages have been exposed the laser unit 3 is raised from the plate 6 and the laser carriage 11 moves a predetermined distance in the Y-direction to enter a position for exposing the next series of, for instance, four pages.

When now a row consisting of eight pages has been exposed the exposure table 5 moves a distance corresponding to two pages in the X-direction, whereafter the next sequence of exposure of 4+4 pages is started. Correspondingly the exposure table 5 and the laser unit 3 step forward until the full series of 8 exposures (8*4=32 pages) is completed, whereupon the exposure table 5 is moved to a position above the discharge conveyor 4, which receives the plate 6, as known per se, and forwards same to a means for development or any other supplementary handling. At the same time as the ready exposed plate is deposited on the discharge conveyor 4 the plate loading lift 2 collects a new, un-exposed plate 6 from the plate cassette 5 and a new cycle is started.

I claim:

1. A method of exposing rows of images onto a light sensitive plate using laser light comprising the steps of:

placing a light sensitive plate onto an exposure table which is movable stepwise in a first direction;

stepwise positioning the exposure table at a predetermined position close to a laser unit which includes a base and a laser carriage stepwise movably mounted to the base whereby a first row of the plate is beneath the base and a first portion of the first row is beneath the laser carriage;

lowering and locking the laser carriage on which a laser gun is movably mounted into engagement with the first portion of the first row of the plate;

moving the laser gun relative to the laser carriage to sweep a laser light emitted from the laser gun onto the first portion of the plate and hence to expose at least one image on the first portion;

raising the laser carriage from the plate;

moving the laser carriage relative to the base stepwise in a second direction perpendicular to the first direction whereby a second portion of the first row of the plate is beneath the laser carriage;

repeating the lowering and locking step, the moving the laser gun step, and the raising step to expose at least one image on the second portion;

repeating the stepwise positioning step, the lowering and locking step, the moving the laser gun step, the raising step, the moving the laser carriage step, and the first-mentioned repeating step whereby a second row is positioned beneath the base and first and second portions of the second row have images exposed thereon; and discharging the plate from the exposure table.

2. A method of exposing a light sensitive plate as claimed in claim 1 wherein said placing step includes the step of picking up a succeeding light sensitive plate from a plate cassette of such plates as said discharging of a plate step occurs whereby a new light sensitive plate is exposed in turn by an automated handling process.

3. An apparatus for exposing rows of images onto a light sensitive plate using laser light comprising:

an exposure table on which the plate is placed;

a table mounting means for mounting said exposure table for stepwise movement in a first direction so that said exposure table is moved to predetermined positions where selected rows of the plate are to be exposed;

a laser unit closely adjacent said table mounting means which exposes the selected rows of the light sensitive plate with images, said laser unit including a base beneath which said exposure table and hence selected rows of the plate are moved with said table mounting means, a laser carriage, a carriage mounting means for mounting said laser carriage for stepwise movement relative to said base in a second direction perpendicular to the first direction whereby respective portions of the selected row of the plate are stepwise beneath said laser carriage, a laser gun, and a gun mounting means for mounting said laser gun for movement relative to said laser carriage so that an image is swept onto the respective portion of the selected row of the plate therebeneath;

a locking means (a) for repeatedly lowering and locking said laser carriage into engagement with the respective portions of selected rows of the plate therebeneath so that the respective portions are exposed with at least one image by said laser unit and (b) for repeatedly raising said laser carriage out of engagement with the respective portions of the selected rows after exposure thereof so that after a movement of said laser carriage a subsequent respective portion of a selected row is likewise exposed with at least one image and so that after all of the respective portions of a selected row have been exposed said exposure table is moved to bring a new selected row underneath said base for a likewise exposure of the respective portions thereof; and a discharge means for discharging the plate from said exposure table after all of the selected rows have been exposed.

4. An apparatus for exposing a light sensitive plate as claimed in claim 3 and further including a cassette of said plates and a picking means for picking up a succeeding light sensitive plate from said plate cassette as a preceding exposed plate is discharged by said discharging means for placement on said exposure table.

5. An apparatus for exposing a light sensitive plate as claimed in claim 3 wherein said base includes a central opening; and wherein said laser carriage includes a light sealed box having a foot which projects downwards through said central opening of said base and which said foot is brought into contact about the respective portion of the selected row of the plate therebeneath on said exposure table by said locking means.

\* \* \* \* \*